United States Patent
Partiwala et al.

(10) Patent No.: US 7,113,115 B2
(45) Date of Patent: Sep. 26, 2006

(54) VARIABLE LENGTH CODE TABLE LOOK UPS

(75) Inventors: Suketu R. Partiwala, Chandler, AZ (US); Kalpesh D. Mehta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 21 days.

(21) Appl. No.: 10/882,460

(22) Filed: Jun. 30, 2004

(65) Prior Publication Data

US 2006/0001555 A1    Jan. 5, 2006

(51) Int. Cl.
*H03M 7/40*    (2006.01)
(52) U.S. Cl. ............................. 341/67; 341/65; 341/106
(58) Field of Classification Search .................. 341/67, 341/65, 106, 50, 51
See application file for complete search history.

(56) References Cited

U.S. PATENT DOCUMENTS

| | | | |
|---|---|---|---|
| 5,539,401 A * | 7/1996 | Kumaki et al. ................ | 341/67 |
| 6,278,801 B1 * | 8/2001 | Boon ........................... | 382/246 |
| 6,324,306 B1 * | 11/2001 | Natsume ....................... | 382/246 |
| 6,414,608 B1 * | 7/2002 | Nishida et al. ................ | 341/67 |
| 6,546,053 B1 * | 4/2003 | Ishii ......................... | 375/240.27 |
| 6,587,057 B1 * | 7/2003 | Scheuermann ................ | 341/67 |
| 6,738,525 B1 * | 5/2004 | Iwata .......................... | 382/246 |
| 6,856,264 B1 * | 2/2005 | Webb ........................... | 341/67 |
| 6,879,268 B1 * | 4/2005 | Karczewicz .................. | 341/67 |

* cited by examiner

*Primary Examiner*—Linh Nguyen
(74) *Attorney, Agent, or Firm*—Blakely, Sokoloff, Taylor & Zafman LLP

(57) ABSTRACT

Embodiments relate to converting or compressing symbols or run, level pair of an input digital video or image data stream to variable length code (VLC) by looking the symbols or run, level pairs up in a table including a binary code, a length code, and a flip code and constructing the VLC therefrom. For instance, the binary code may identify a first non-zero portion of the VLC, the length may identify the length of the VLC, and the flip code may identify whether or not the first portion and a number of 0's appended to the first portion to form a VLC having the length given by the length code, must be inverted to create the VLC. Also, the table may include entries grouped according to symbol or run, level pair values, and an address offset determined by the symbol or run, level pair or the input may be used to access the binary, length, and flip code from the appropriate group.

28 Claims, 6 Drawing Sheets

VARIABLE LENGTH CODE TABLE LOOK UPS

BACKGROUND

1. Field

Digital data conversion and compression.

2. Background

Video and image data conversion and compression is often used to speed up processing of video and image data streams, such as to provide a display of the video and images that is smooth and appealing to a viewer. For example, converting or mapping an input stream of video or image data to a shorter stream of variable length code (VLC) codes (e.g., a process that may be referred to as "variable length coding") may be performed by looking up the input stream in a "lookup" or "conversion" table stored and packing the output stream with VLC corresponding to the input stream. Specifically, code tables having a VLC coding referred to as "Huffman coding" are widely used in video compression algorithms like Moving Picture Experts Group (MPEG) (e.g., such as MPEG2 or MPEG4), H.26x, Joint Photographic Experts Group (JPEG), etc. to compress video and image data.

BRIEF DESCRIPTION OF THE DRAWINGS

Various features, aspects and advantages will become more thoroughly apparent from the following detailed description, the set claims, and accompanying drawings in which:

DETAILED DESCRIPTION

Figure 1:
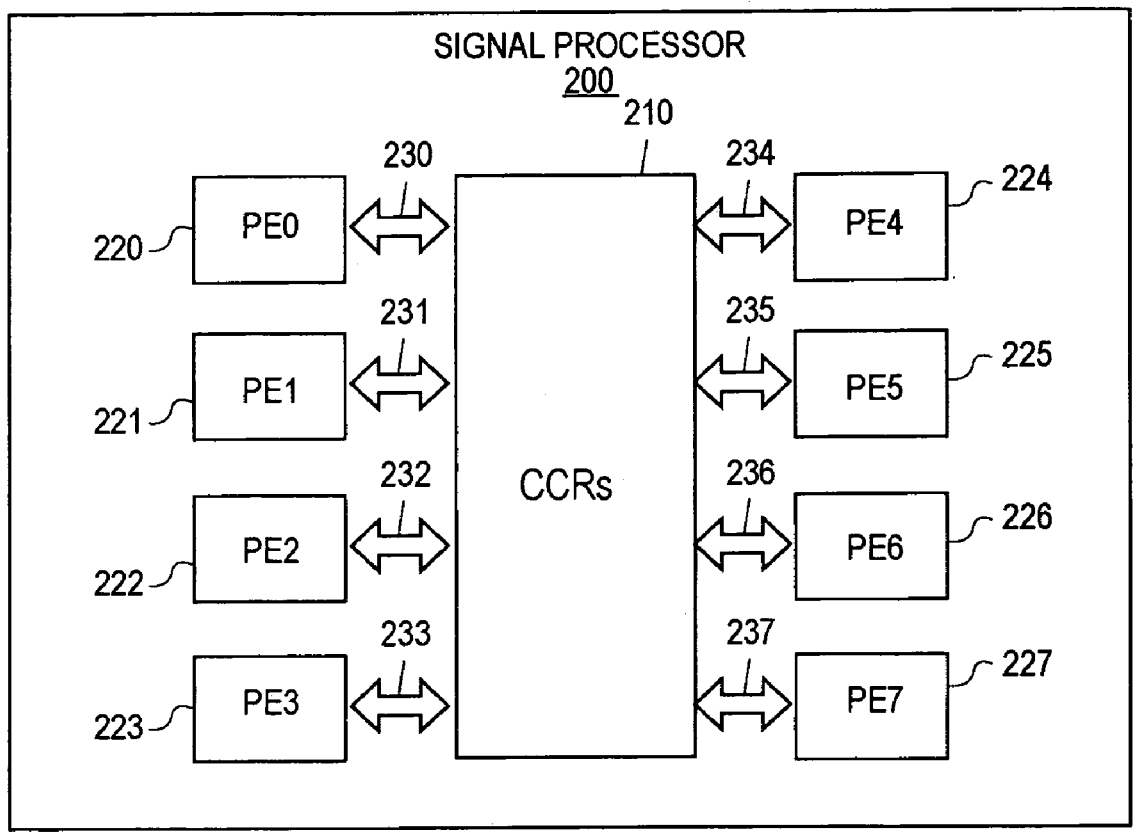
FIG. 1 is a block diagram of a signal processor showing eight processing elements (PEs) intercoupled to each other via cluster communication registers (CCRs), according to one embodiment of the invention.

FIG. 1 is a block diagram of an image signal processors (ISP) (e.g., such as a digital signal processor for processing video and/or image data) having eight processing elements (PEs) intercoupled to each other via cluster communication registers (CCRs), according to one embodiment of the invention. As shown in FIG. 1, signal processor 200 includes eight programmable processing elements (PEs) coupled to cluster communication registers (CCRs) 210. Specifically, PE0 220 is coupled to CCRs 210 via PE CCR coupling 230, PE1 221 is similarly coupled via PE CCRs 231, PE2 222 via coupling 232, PE3 223 via coupling via 233, PE4 224 via coupling 234, PE5 225 via coupling 235, PE6 226 via coupling 236, and PE7 227 is coupled to CCRs 210 via coupling 237. According to embodiments, CCRs for coupling each PE to every other PE, may have various electronic circuitry and components to store data (e.g., such as to function as a communication storage unit, a communication register, a memory command register, a command input register, or a data output register as described herein). Such electronic circuitry and components may include registers having a plurality of bit locations, control logic, logic gates, multiplexers, switches, and other circuitry for routing and storing data.

Moreover, signal processor 200 may be coupled to one or more similar signal processors, where each signal processor may also be coupled to one or more memory and/or other signal processors (e.g., such as in a "cluster"). Also, each cluster may be coupled to one/or more other clusters. For instance signal processor 200 may be connected together in a cluster of eight or nine digital signal processors in a mesh configuration using Quad-ports. The quad-ports can be configured (statically) to connect various ISP's to other ISP's or to double data rate (DDR) random access memory (RAM) using direct memory access (DMA) channels. For example, signal processor 200 may be or may be part of programmable multi-instruction multiple data stream (MIMD) digital image processing device. More particularly, signal processor 200, whether coupled or not coupled to another signal processor, can be a video/image processing unit used for processing related to a copier, a scanner, a printer, or other image processing device including to process a raster image, a Joint Photographic Experts Group (JPEG) image, a Moving Picture Experts Group (MPEG) image, or other digital or video image data.

In addition, signal processor 200 can use several PE's connected together through CCRs 210 (e.g., such as where CCRs 210 is a register file switch) to provide a fast and efficient interconnection mechanism and to maximize performance for data-driven applications by mapping individual threads to PE's in such a way as to minimize communication overhead. Moreover, a programming model of the ISP's can be implemented is such that each PE implements a part of a data processing algorithm and data flows from one PE to another and from one ISP to another until the data is completely processed.

Moreover, in embodiments, a PE may be one of various types of processing elements, digital signal processors, video and/or image signal processors for processing digital data. Similarly, a PE may be an input to read access to Quad-ports (e.g., such as Quad-ports of one or more other ISP's), an output to send data to Quad-ports (e.g., such as to write data to Quad-ports of one or more other ISP's), a hardware accelerator (HWA), memory controller, and/or a memory command handler (MCH). For example, one of the PE's (e.g., PE0 220) may be an input from another ISP, one of the PE's (e.g., PE1 221) may be an output to other ISP, from one to three of the PEs (e.g., PE5 and PE6) may be configured as HWAs, and one of the PEs (e.g., PE7 227) may be configured as a MCH functioning as a special HWA to manage the data flow for the other PE's in and out of a local memory. Thus, for example, an embodiment may include a cluster of PEs interconnected through CCRs 210, where CCRs 210 is a shared memory core of up to sixteen CCRs and each CCR is coupled to and mapped to the local address space of each PE.

Figure 2:
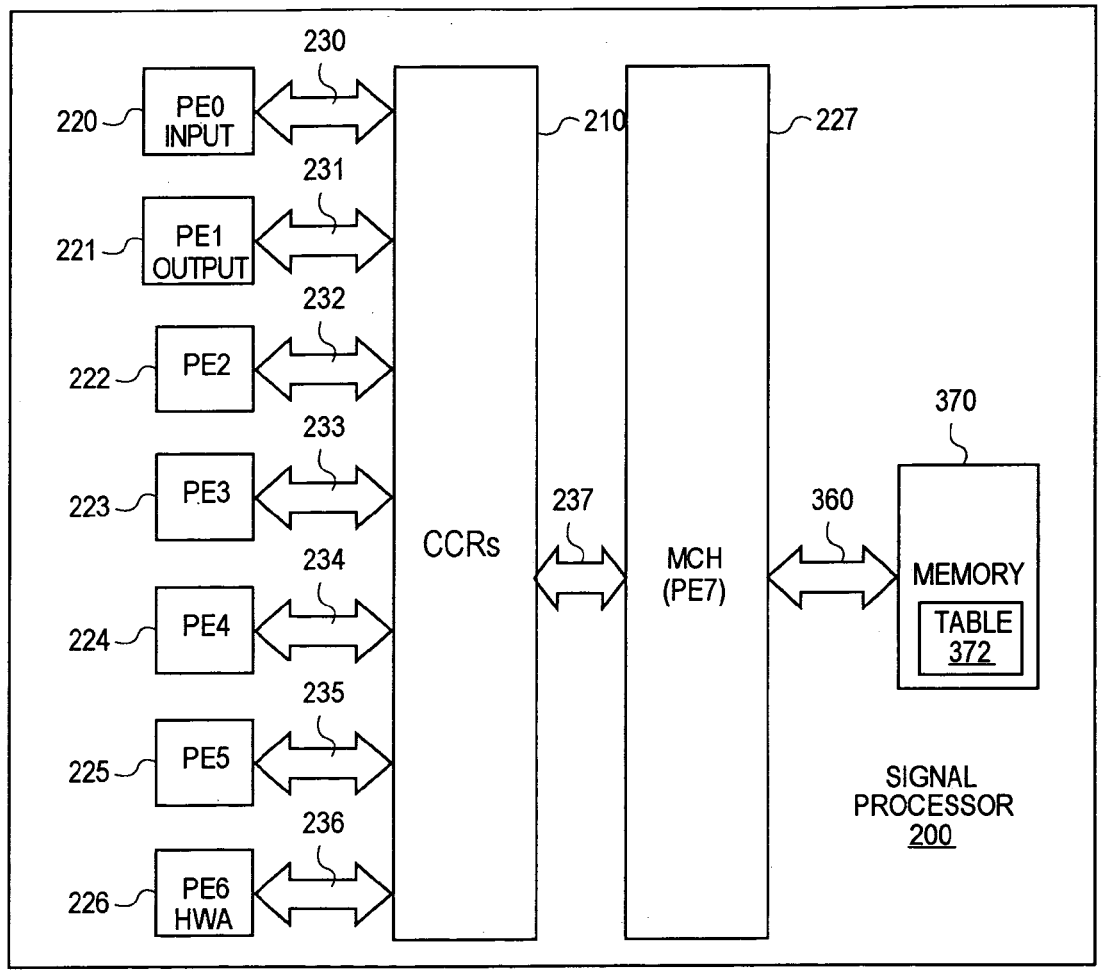
FIG. 2 is a block diagram of a memory command handler (MCH) coupled between a memory and the CCRs for retrieving data from the memory for use by the PEs, according to one embodiment of the invention.

FIG. 2 is a block diagram of a memory command handler (MCH) coupled between a memory and the CCRs, for retrieving and writing data from and to the memory for use by the PEs, according to one embodiment of the invention. As shown in FIG. 2, MCH 227 (e.g., PE7 configured and interfaced to function as a memory control handler, as described above with respect to FIG. 1) is coupled via MCH to CCR coupling 237 (e.g., coupling 237, as described above with respect to FIG. 1) to CCRs 210 which in turn are coupled to each of PE0 220 through PE6 226 via CCR PE0 coupling 230 through CCR PE6 coupling 236. In addition, MCH 227 is coupled to memory 370 via MCH memory coupling 360. Therefore, the PEs may read and write data to memory 370 via MCH 227 (e.g., such as by MCH 227 functioning as a central resource able to read data from and write data to CCRs 210).

According to embodiments, memory 370 may be a static RAM (SRAM) type memory, or memory 370 may be a type of memory other than SRAM. Memory 370 may be a local signal processor memory used for storing portions of images and/or for storing data temporarily. Thus, memory 370 may be an SRAM MCH memory, similar to a cache memory, used to temporarily store portions of images or complete image data that may originate from a DDR and may be staged in MCH 227.

Within signal processor 200, or a cluster of such signal processors (e.g., ISPs), Input PE and Output PE may be the gateways to the rest of the ISPs and can also be programmed to some level of processing. Other PEs within an ISP may also provide special processing capabilities. For instance, PE's acting as HWA's of signal processor 200 (e.g. such as PE 6 and/or other PE's as shown in FIGS. 1 and 2) may perform video and image processing functions, such as discrete cosine transformation (DCT), motion estimation, variable length coding (VLC), etc. Moreover, according to embodiments, by using a combination of HWA's and programmable PE's, signal processor 200 can provide a selected performance and a selected programmability. For example, one or more PE's of an ISP may be selected to function as a HWA to perform VLC (e.g., such a PE may be referred to as a "VLC HWA") that can be programmed to implement one or more of a multitude of compression standards for video/image processing.

For example, the apparatus, systems, software, and processes describe herein (e.g., such as the apparatus shown in FIGS. 1 and 2), may provide a memory efficient and performance efficient method of implementing generic VLC table lookups in a MIMD machine. It could be used for other programmable VLC coder implementations as well. In some embodiments, converting or mapping an input stream of video or image data to a shorter stream of VLC codes may be performed by a PE (e.g., such as a HWA VLC PE) within signal processor 200 (e.g., such as a video/image processing unit) looking up the input stream in a "lookup", "compression", or "conversion" table stored in memory 370 (e.g., such as a local data memory) under Memory Command Handler (e.g., MCH 227) control.

In other words, as shown in FIG. 2, one or more data structures, data converters, lookup tables, and/or encoders may exist at table 372 for converting, translating, corresponding to, associating, representing, and/or compressing run, level pairs to variable length codes. It is also contemplated that such data structures or look up tables may be stored in or may be part of MCH 227. Either way, a PE may use MCH commands to look up symbols or run, level pairs, and convert them into VLC, such as by identifying a memory address or location in a memory for, at, or according to the symbols or run, level pairs and retrieving or reading appropriate information to connect to or generate VLC for the symbols or run, level pairs. By assigning VLC codes having a generally shorter length than the corresponding input stream segments the VLC codes represent, an output stream of data including VLC codes may then be packed to provide an output stream with VLC corresponding to the input stream, but having less data than the input stream.

For example, variable length coding based on Huffman code (e.g., "Huffman coding") is a popular lossless data compression technique, recommended by many image and video standards, such as JPEG, MPEG (e.g., such as MPEG2 and MPEG4). Huffman coding reduces data redundancy based on assigning shorter codeword to more frequent symbols, and longer codeword for less frequent symbols. Therefore, a VLC HWA may perform run level encoding, Huffman coding, and/or bit packing of an input digital data stream, such an input stream of MPEG (e.g., such as MPEG2 or MPEG4), H.26x, or JPEG data (e.g., such as encoding or compression of an Excel™ video bit stream), to provide a compressed output data stream having less data than the input stream.

TABLE 1

An example of VLC codeword lookup table

| Run | Level | Variable length code |
|---|---|---|
| 1 | 1 | '011 |
| 0 | 2 | '0100 |
| 0 | 8 | '000000011101 |
| 0 | 9 | '000000011000 |
| 0 | 10 | '000000010011 |
| 0 | 11 | '000000010000 |
| 30 | 1 | '0000000000011100 |
| 31 | 1 | '0000000000011011 |
| 1 | 3 | '1111001 |

The Huffman coding of data from run level encoding may be done by assigning each input condition (e.g., such as each or some run, level pair possibilities that may result from the run level encoding), a unique VLC code word, which is a variable in length. The codeword assignments can be derived using probabilistic analysis of the data patterns for a particular application (e.g., such as applications where the input data stream is video, images, etc.). Table 1 shows an example of VLC codeword to run, level pair assignment table. Table 1 shows a small portion out of a run, level pair assignment to MPEG2 VLC code. The input to Table 1 is run, level pair and output is the Variable Length Code (e.g., VLC such as a Huffman code).

Other similar assignments may be found, for instance, in variable length code look up tables for MPEG2 defined in *Information technology—Generic coding of moving pictures and associated audio information: Video, INTERNATIONAL STANDARD*, ISO/IEC 13818-2, Table B.14 and Table B.15, Second Edition (Dec. 15, 2000) (herein "the B.14 and B.15 tables"). According to the B.14 and B.15 tables, the run portion of the run, level pair can take a value of between 0–31 (5-bits) and the level portion can take a value of between 1–40 (6 bits). Also, included in the tables, for each run, level pair, is a VLC entry and a length. Each VLC entry is 16 bits of data and a corresponding length required to represent each VLC's length is 5 bits (e.g., it is eventually necessary to represent or identify the length of each VLC to the bit-packer, in order for the VLCs to be bitpacked).

Consider, for example, implementing a VLC encoder for a VLC table with 128 entries (e.g., such as described above with respect to table 372). The maximum length of the VLC table entry is 16 bits. In accordance with one embodiment, the encoder can be implemented using 2 tables in MCH 227 or memory 370 (e.g., such as by two tables in table 372).

One table that holds the 16 bit VLC code bit pattern and another table that holds 5 bits of information code identifying the number of bits or length of the VLC code bit pattern (since the VLC codes are variable length). For each input, 2 lookups may be performed. For instance, one lookup is required to retrieving or reading the VLC code bit pattern and another lookup is required to retrieving or reading the length information (e.g., such as by a PE performing two reads from memory 370 via MCH 227). This implementation requires large amount of memory (e.g., such as 224*2 Bytes for codes and 224*2 Bytes for length (since the MCH is word oriented), and requires 2 look ups (e.g., such as 2 accesses to MCH 227 to retrieve or read data from memory 370). Thus a memory to store the lookup tables for this example requires at least 224*2 Bytes for codes and 224*2 Bytes for length=896 Bytes of data storage capacity.

Note that it is contemplated that lookup tables as described above, such as one or more tables, where one table holds a VLC code bit pattern and another table that holds information identifying the number of bits or length of the VLC code bit pattern may be implemented as partitioned tables or tables having groups. For instance, those tables may be sorted, divided, or partitioned in groups of symbols or run, level pairs and corresponding groups of combinations as described with respect to FIGS. 4–6 below (e.g., such as groups of combinations that are unique or are VLC code, as described below).

However, according to embodiments, MCH 227 and/or table 372 may have one or more data structures, data converters, lookup tables, and/or encoders implemented using three fields of information with a maximum length of less than 16 bits of data per entry to convert, translate, correspond to, be associated with, represent, and/or compress symbols or run, level pairs to variable length codes. Moreover, the three fields of information may require only one lookup, access, or read to obtain or retrieve sufficient information to produce a VLC codes from a symbol or a run, level pair.

For example, table 372 may contain or store a field containing only a small subset of the 16 bit VLC code bit pattern and the rest of the bits to form the 16 bit VLC code bit pattern could be derived by a Processing Element (PE) from two other fields.

Thus, for input data, a lookup table or data structure stored in table 372 may include three fields, instead of the 16 bit MPEG2 VLC code bit pattern shown in Table 1. The three fields may be a binary code (excluding the leading zeros), a length code or identifier (length of the VLC code including leading zeros, such as the 4 bits of code identifying the length of the VLC code bit pattern described above), and a flip code (e.g., which may be a single bit, such as an inversion bit to identify whether the binary code and leading zeros need to be inverted or not to provide the corresponding VLC code). With the three fields, it is possible to represent all of the VLC codes in MPEG2 Table B.14 and B.15 with 11 bits (e.g., as compared to 16 bits used in Table B.14 and B.15). For instance, Table 2 is a representation of the assignments of Table 1 implemented in three fields instead of the 16 bit VLC code bit pattern. Note that the three fields (e.g., binary code, a length code, and an inversion bit or a flip code) may form a combination (e.g., such as a unique combination where each value of the three fields for a symbol or run, level pair is unique or different, and does not repeat in the table).

TABLE 2

An example of a three field combination lookup table

| Run | Level | Binary_code (6b) | Length (4b) | Flip (1b) |
|---|---|---|---|---|
| 1 | 1 | 3 | 3 | 0 |
| 0 | 2 | 4 | 4 | 0 |
| 0 | 8 | 29 | 12 | 0 |
| 0 | 9 | 24 | 12 | 0 |
| 0 | 10 | 19 | 12 | 0 |
| 0 | 11 | 16 | 12 | 0 |
| 30 | 1 | 28 | 16 | 0 |
| 31 | 1 | 27 | 16 | 0 |
| 1 | 3 | 3 | 7 | 1 |

Thus, Table 2 may represent a data structure, data converter, lookup table, and/or encoder as described herein and including rows of conversion entries and columns of fields of data or data categories, such as a table of data existing at or stored in a table, such as table 372 as described herein. What's more, in this implementation, a second lookup to retrieve or read length information identifying the number of bits or length of the VLC code bit pattern is not necessary because the length information is one of the three fields of Table 2. Thus, the length code here may be used to create or construct the VLC code for the run, level pair, as well as to eventually represent or identify the length of the VLC to a decoder.

For example, the binary code may identify, represent, or be equal to a first portion of a variable length code conversion for the associated data symbols or run, level pair. Specifically, the binary code may include the asserted bits, set bits, unasserted bits, and/or reset bits of a first portion of a variable length code (e.g., such as where an asserted bit may be a data high entity, such as a logical "1"; and an unasserted bit may be a data low entity, such as a logical "0" for the data symbol or run, level pair). Moreover, the binary code may include all of the asserted bits of a VLC for the data symbol or run, level pair; or all of the unasserted bits having an inverse corresponding to asserted bits of a VLC for the data symbol or run, level pair. Also, the binary code may have an asserted most significant bit (MSB). Note that an inverse is a selection or portion of bits where all asserted bits are converted to unasserted bits and vice versa, such as by converting all 0's to 1's and all 1's to 0's in a selection portion of bits. In addition, the length code may indicate a second portion of the variable length code conversion for the symbol or run, level pair, specifically, the second portion may be a set of bits corresponding to an unasserted or an inverse of an unasserted portion of the variable length code. The flip code or inversion bit may indicate whether the first and second portions are the inverse of the variable length code conversion for the symbol or run, level pair. Specifically, the flip code may indicate whether the binary code and a number of 0's appended to the binary code according to the length code are to be inverted to form the variable length code. In one embodiment, the binary code may exclude leading 0's and include up to a first selected number of bits, such as up to 6; the length code may include up to a second selected number of bits, such as 4 or 5 bits, that is less than the number of bits of the binary code; and, the flip code may include up to a third selected number of bits, such as 1 bit (e.g., an inversion bit), that is less than the number of bits of the length code.

It is to be appreciated that the input stream may be a video or image data having a plurality of asserted and unasserted entities (e.g., such as where an "entity" is a collection of bits, such as by being a byte having 8 bits, thus an asserted entity would have a logical non-"0" value (e.g., such as by having a logical "1") somewhere amongst its 8 bits, while an un-asserted entity would have a logical "0" for all 8 of its bits. For instance, VLC HWA may run level encode bytes of an un-encoded or input video or image data stream to an output, encoded or converted set of data symbols, such as where each data symbol is or represents a run byte and a level byte. The value of the run byte indicates a number of unasserted bytes (e.g., such as byte entities equal to logical "0"'s) before an asserted byte (e.g., such as one or more byte entities equal to or including a logical "1", or otherwise defining a non-"0" logical value) of a digital data stream of image data. The value of the level byte indicates the level, logical value, or numeric equivalent (e.g., such as base-10, or hexadecimal equivalent or conversion) of the asserted byte of the digital data stream of image data.

Thus, in one embodiment, a PE of signal processor 200, such as PE4 224 and/or PE6 226 may derive or generate a run, level pair from an input byte stream, where the run, level pair can subsequently be used as input to perform a look up in a look up table to identify and/or retrieve a variable length code associated or corresponding to that run, level pair. Specifically, the VLC HWA may Huffman code the run, level pairs into variable length Huffman code. Then, the VLC HWA may bit pack the Huffman code with other Huffman code and/or escape coding (e.g., such as escape coding having leading information identifying it as escape coding and fixed length run, level pair information), where the escape coding is distinguishable from VLC to form a stream of coded video or image data from the un-encoded video or image data. Hence, a PE of signal processor 200 can convert an input stream to a stream of standard variable length code for a variety of standard or non-standard (e.g., such as code tables according to a Huffman coding algorithm for lossless data compression).

Specifically, for a VLC table with 128 entries, such as the example discussed above, a table with three fields reduces the memory data storage required to at least 224*2 Bytes for codes, length, and flip (e.g., such as compared to the memory requirement of at least 224*2 Bytes for codes and 224*2 Bytes for length=896 Bytes of data storage capacity for the prior example). Moreover, the number of accesses to memory 370 and/or to MCH 227 are reduced by half, thus improving the performance of the VLC lookup.

It is also considered, that for cases where there are VLC code words that exceed the pre-determined limit addressed by a three field table, the excessive words can be split the codes into two or more parts or portions in the three field table, each part or portion having an escape code in the length code field. Then, when the length code field matches an escape code (e.g., matches a pattern discernable by a PE, MCH, processor, or component thereof), a second level of table look up can be performed to obtain the complete VLC or escape code to be packed into the output data stream.

Also, according to embodiments, for situations where table 372 includes redundant or repeat entries of symbol or run, level pair, or groups of run, level pair where the run value, the level value are held constant (e.g., such as by table 372 storing entries of more than one table for converting symbol or run, level pair to VLC) the redundant or repeated entries or groups from one or more tables may be combined and/or used to define groups of table 372, distinguished or identified by these entries or groups. For instance, one version of Table 2 may include entries for MPEG2 data conversion for the two lookup tables B.14 and B.15, which share or include many of the same or many common run, level pair entries. These 'common' entries may be used to partition the tables.

Figure 3:
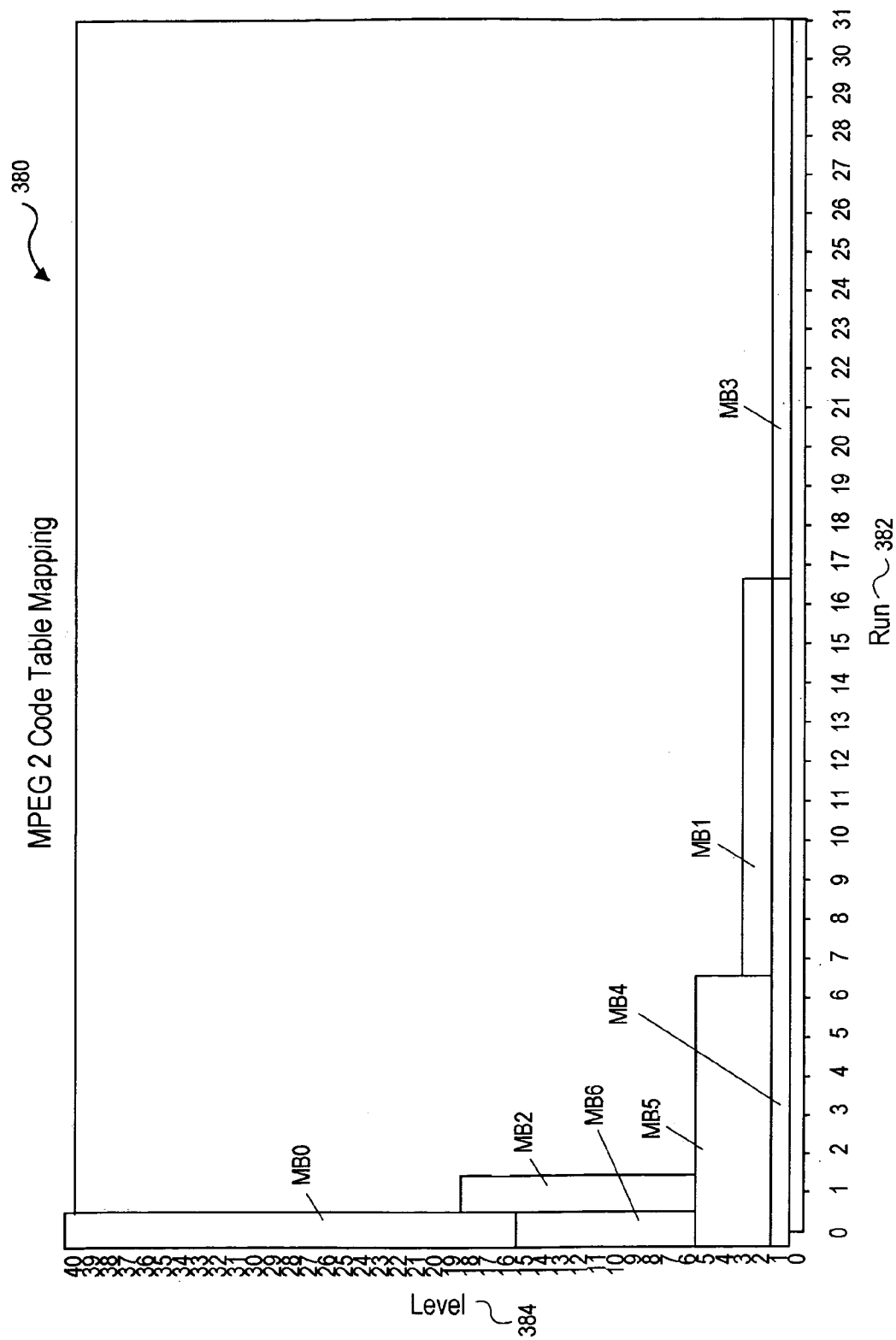
FIG. 3 is a graph plotting level of a run, level pair versus run of a run, level pair for a table having groups of entries.

Specifically, for instance, FIG. 3 is a graph plotting level of a run, level pair versus run of a run, level pair for a lookup table having groups of entries. FIG. 3 shows mapping 380 including run, level pairs mapped against level axis 384 and run axis 382. As shown in FIG. 3, the run, level pairs are arranged into 7 groups of entries or groups as described above identified as Memory Blocks (MBs). Thus, FIG. 3 shows MB0, MB1, MB2, MB3, MB4, MB5, and MB6. Each MB may be indexed using a unique combination of run and level pair. In addition, common code or run, level pairs of mapping 380 may be included in specific MBs. For instance, if mapping 380 includes run, level pair to three field conversion entries for Table B.14 and Table B.15, most of the common code or run, level pairs of Table B.14 and Table B.15 may be combined in MB0, MB1, and MB3. In addition, combining the common code or run, level pairs reduces the total number of entries in mapping 380 to just 172 run, level pair entries.

Thus, table 372 as described herein may include mapping 380 or a similar table of data having selected groups of symbols or run, level pairs defined by and/or excluding symbols or run, level pairs where (1) the symbols or run, level pairs are repeated in symbol or run, level pair to variable length code conversion tables, (2) symbols or run, level pairs having a constant run value and a varying level value, symbols, or (3) run, level pairs having a constant level value and a varying run value. Moreover, the symbols or run, level pairs in table 372 (e.g., such as corresponding to mapping 380) may be unique such as where each symbol or run, level pair is different and is not repeated in table 372 or mapping 380. Also, the groups of data symbols or run, level pairs may be separated by, distinguished by, discriminated by, include, be initiated by, and/or have a first data symbol or run, level pair corresponding to, identified by, or associated with a memory address offset (e.g., such as a selected memory address offset corresponding to that group or a position in table 372 or identified by mapping 380 for that group). Thus, entities, lookups, retrieval, reading, offsets or base addresses (e.g., such as memory address offsets or base addresses to be added to a symbol or run, level pair or address corresponding to a symbol or run, level pair to find a location in memory) may be used or determined for obtaining binary code, length code, and flip code entries from memory for a corresponding symbol or run, level pair.

Figure 4:
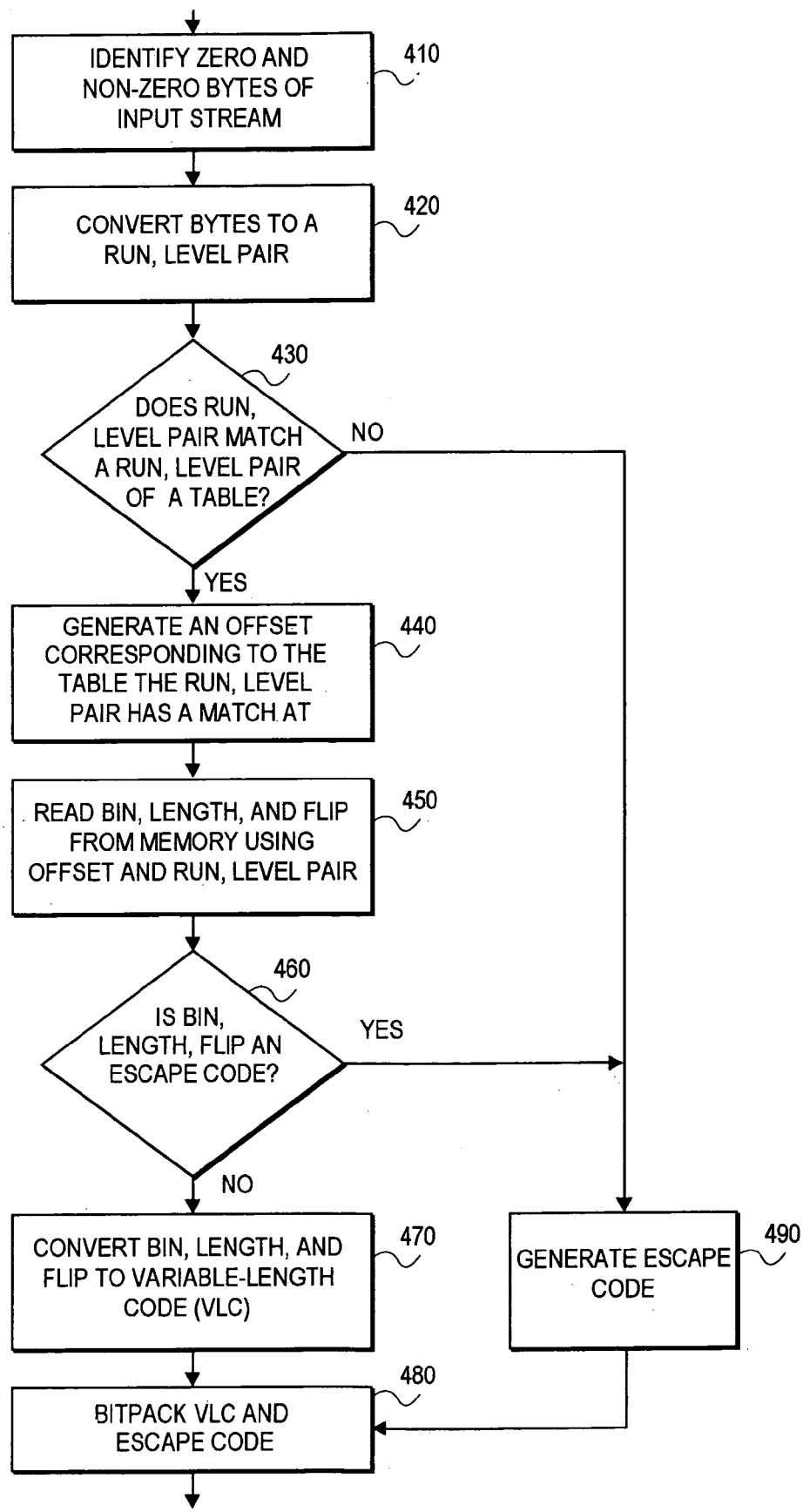
FIG. 4 is a flow diagram of a process for converting digital image data to variable length code.

FIG. 4 is a flow diagram of a process for converting digital image data to variable length code. At block 410, 0 and non-0 bytes of an input stream are identified. For example, block 410 may include identification of unasserted entities or bytes and asserted entities, bytes or portions of an input stream including asserted bytes, such as is described above with respect to run level encoding, as described above with respect to FIG. 2. At block 420, the identified 0 and non-0 bytes of the input stream are converted to run, level pairs. For example, block 420 may include converting or encoding identified bytes or entities of a video or image digital data input stream to symbols or run, level pairs as described above with respect to FIG. 2.

At decision block 320, it is determined whether a run, level pair matches a run, level pair included in a table. For example, at block 430, a symbol, or the values of a run, level pair may be compared to values in a lookup table or data structure having run, level pair to unique combinations or VLC code identifying information to determine whether there is a match or corresponding entry for the run, level pair being looked up. If at block 430 the run, level pair does not match a run, level pair of a table, the process continues to block 490. Alternatively, if at block 430 the run, level pair does match a run, level pair of a table, the process continues to block 440. At block 440, an offset corresponding to the table that the run, level pair matched a run, level pair of. An offset is generated corresponding to the table that the run, level pair matched a run, level pair of. For example, at block 440, a memory address offset for a symbol or run, level pair is identified, determined, or looked up, where the memory address offset corresponds to or is a memory address of a first entity of a selected group of symbols or run, level pairs stored in a memory (e.g., such as stored in a table or data structure as described above with respect to table 372). For example, the offset may correspond to, identify, or initiate a first address of a group of run, level pairs including or defined by: (1) redundant run, level pairs represented by a single entry for run, level pairs repeated in one or more tables for converting run, level pairs to variable length codes (e.g., such as standard Huffman coding tables); (2) run, level pairs having a constant run value of the run, level pair and a variable level value of the run, level pair; and (3) run, level pairs having a constant level value of the run, level pair, and having a variable run value of the run, level pair. Thus, the offset may be a memory address offset in memory or a group that starts at, is initiated by, is distinguished by, is discriminated by, is separated by, and/or includes the memory address offset.

At block 450, a combination, such as of a binary code, length code, and flip code are read or retrieved from memory using the offset and the run, level pair. For example, block 450 may include retrieving or reading a number of bits including asserted code or a binary code having an asserted most significant bit (MSB) and representing a first portion of a variable length code conversion for the associated symbol or run, level pair. Likewise, block 450 may also include retrieving or reading a length code, such as a length identifier representing or identifying a number of leading zeros or unasserted entities to represent a second portion of the variable length code conversion for the symbol or run, level pair. Moreover, block 450 may include retrieving or reading a flip code to identify or indicate whether the variable length code conversion for the symbol or run, level pair is the inverse of the first and second portions, such as by being the inverse of the binary or asserted code appended with a number of leading 1's or asserted entities to create a variable length code having a length according to the length code.

At decision block 460, it is determined whether the binary code, length code, and flip code are or correspond to an escape code. If the binary code, length code, and flip code correspond to an escape code, the process continues to block 490. If the binary code, length code, and flip code are not an escape code, the process continues to block 470. For example, at block 460 it is determined whether the length code retrieved or read from memory includes escape code values.

At block 470, the binary code, length code, and flip code are converted to a variable length code. For example, at block 470 a number of unasserted bits may be appended to the binary code to produce a lengthened code having a number of bits or lengths indicated by the length code. Then, if the flip code is asserted, the lengthened code, having the binary code and unasserted bits, may be inverted (e.g., such as by converting all the asserted bits to unasserted bits and all the unasserted bits to asserted bits).

At block 480, the variable length code is bit packed with other variable length code and/or escape code. For example, block 480 may include appending the variable length code produced in block 470 to a stream including variable length code (e.g., such as code generated by a process similar to that described in FIG. 4) and/or escape code (e.g., such as escape code described herein, such as with respect to block 490).

At block 490, escape code is generated. For example, block 490 may include generating fixed length code that may be distinguished from variable length code (e.g., such as generating escape code that has 22 bits and is distinguishable by a processor or PE from VLC or Huffman code). Thus, at block 480, an output stream may be generated that includes escape code and variable length code together in a digital data stream representing a compressed version of the input data received at block 410.

Figure 5:
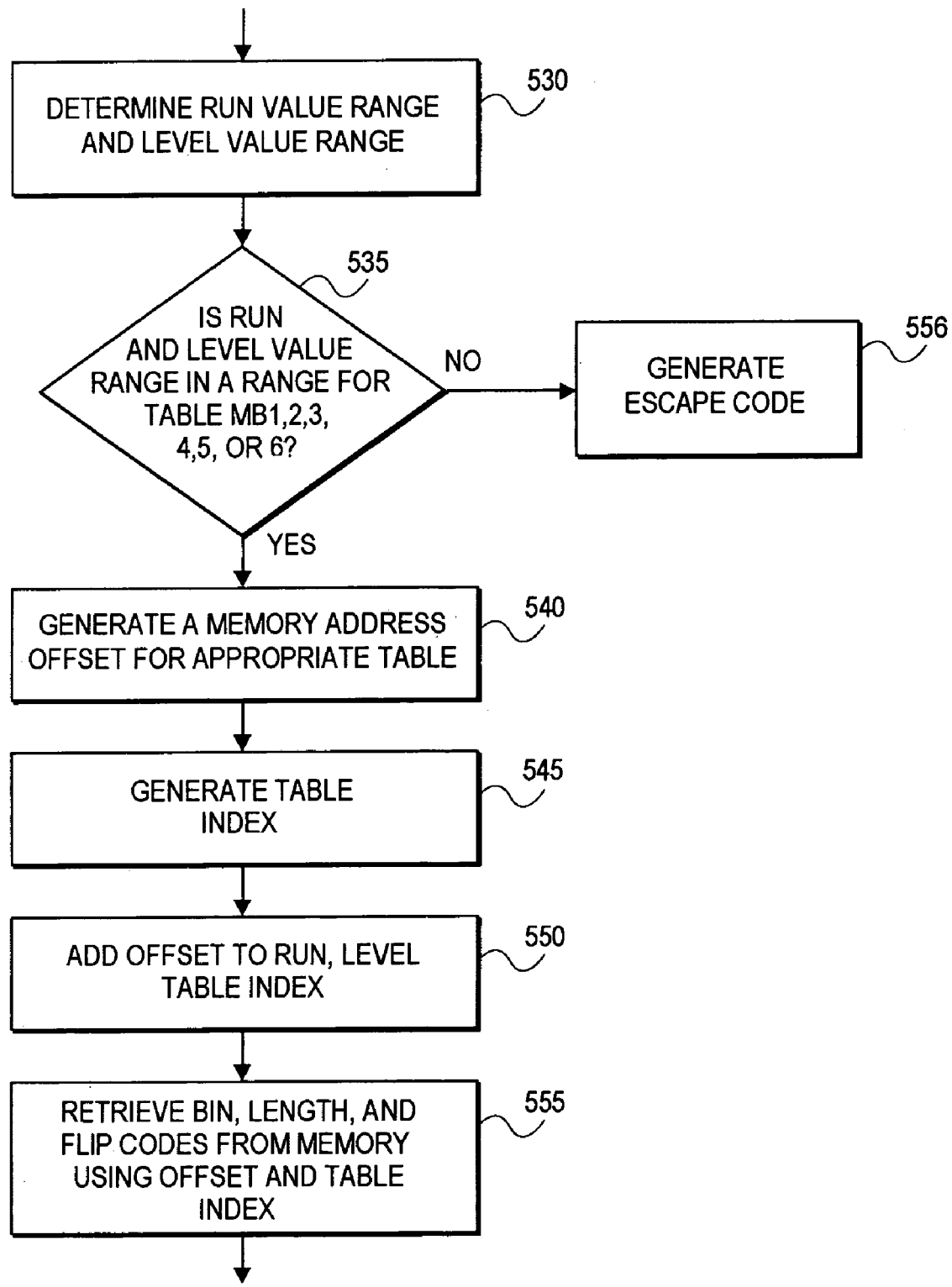
FIG. 5 is a flow diagram of a process for generating a memory address offset.

FIG. 5 is a flow diagram of a process for generating a memory address offset. At block 530, a run value range, a level value range is determined for a run, level pair. For example, block 530 may include range detectors, comparators, or other apparatus such as described below with respect to FIG. 6, for determining whether the values of the run, level pair are within certain programmable, programmed, or selected ranges. It is contemplated that block 530 may be included in block 430 as described with respect to FIG. 4. Additionally, it is contemplated that block 530 may represent a block to receive the output of block 420 as described with respect to FIG. 4. At decision block 535, it is determined whether the run and level value range is within a range for Table MB1, MB2, MB3, MB4, MB5, or MB6. If at block 535 the run and level value range is not within a range for a table, the process continues to block 556. At block 556, escape code is generated. For example, block 556 may correspond to a process as described above for and continue from the process described for block 490 of FIG. 4. If at block 535 the run and level range is not in a range for a table, the process continues to block 540.

At block 540, a memory address offset is generated for the appropriate table. For example, block 540 may include generating an offset for the table of Tables MB1 through MB6 that the run and level range is in a range for. It is considered that block 540 may correspond to block 440 of FIG. 4.

Next, at block 545, a table index or delta related to the offset generated at block 540 and the run, level pair values is generated. For example such and index may be a table index for the run, level pair within a table or group of the run, level pair values beginning at the offset.

Next, at block 550, the offset generated at block 540 is added to the table index generated at block 545. For example, block 550 may include adding a memory address identified by, corresponding to, or equal to the offset, to a memory address identified by, corresponding to, or equal to the table index for the run, level pair values.

At block 555, the binary code, length code, and flip codes are retrieved from the memory using the offset and table index. For instance, block 555 may include reading or retrieving a binary code, length code, and flip code, from an address in memory identified by, corresponding to, or equal to the memory address offset added to the table index. It is considered that blocks 550 and 555 may represent or correspond to block 450 of FIG. 4. Moreover, it is to be appreciated that block 460 of FIG. 4 may occur and continue the flow after block 555 of FIG. 5.

Figure 6:
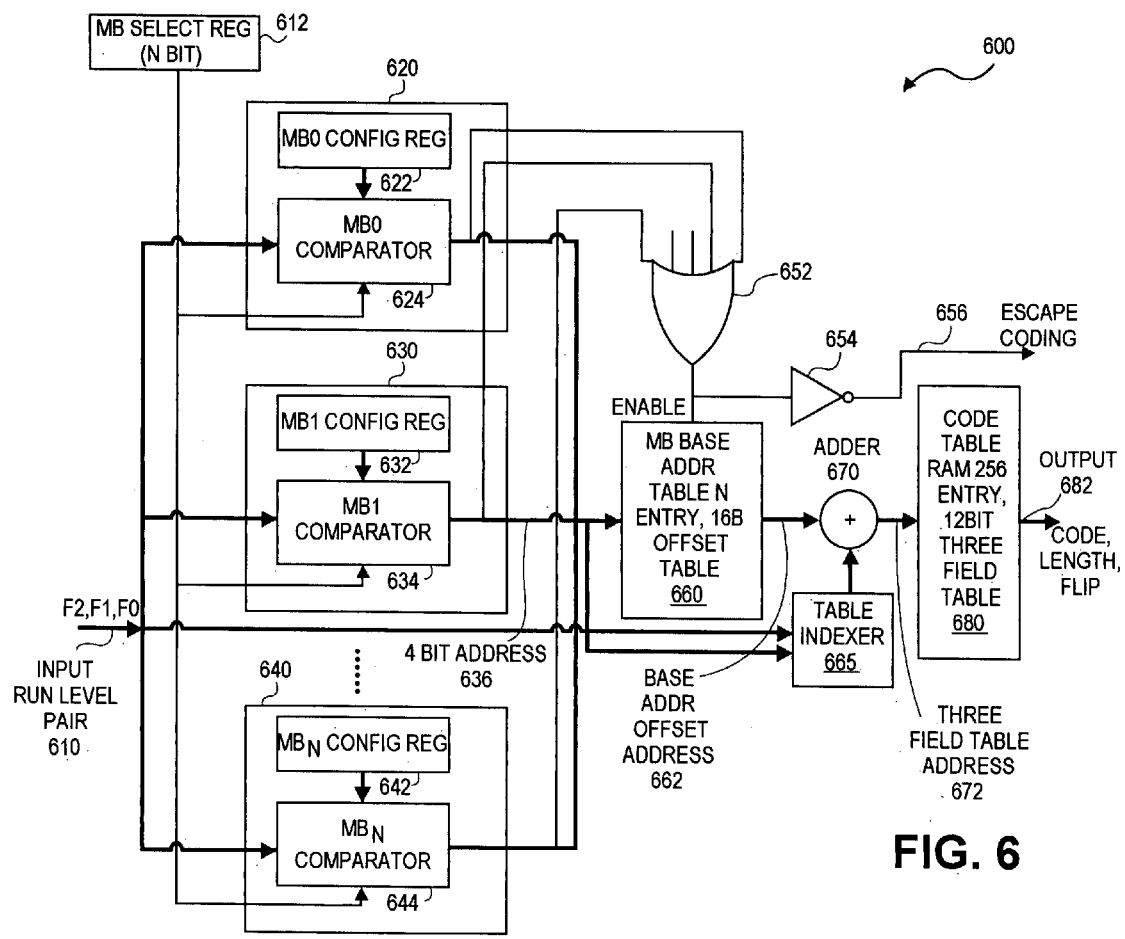
FIG. 6 is a block diagram of an apparatus for generating a binary code, length code, and flip code from a symbol or run, level pair.

FIG. 6 is a block diagram of an apparatus for generating a binary code, length code, and flip code from a symbol or run, level pair. FIG. 6 include input run, level pair 610 and MB select register 612 as inputs to range detector 620, 630, and 640. Input run, level pair 610 may correspond to the output of block 420 of FIG. 4.

Range detectors 620 through 640 include a MB configuration register and a MB comparator. Range detector 620 is representative. Range detector 620 include MB0 configuration register 622 and MB0 comparator 624. MB0 configuration register 622 may be programmable, such as to be programmed to include information for identifying or determining whether the run and level value range is in a range for Table MB0. Range detectors 620 through 640 may correspond to block 530 of FIG. 4 and/or blocks 530 and 535 of FIG. 5. Address 636 is output from one of range detector 620 through 640 to which input run, level pair 610 has a run and level range in a range detected by that range detector. Alternatively, if input 610 does not correspond to a range detected by any of range detector 620 through 640, there will not be an address asserted at address 636 and OR gate 652 will not assert a signal which will cause inverter 654 to activate escape coding signal 656.

If an address is asserted at address 636, that address will cause an enable signal to be sent by OR gate 652 and that address will look up an offset in offset table 660. Offset table 660 and address 636 may correspond to block 440 of FIG. 4 and block 540 of FIG. 5, as described above. Offset address 662 is output from offset table 660 and received by adder 670. Adder 670 also receives a table index for input run, level pair 610 from table indexer 665, which is receives input run, level pair 610 and address 636 (e.g., such as the ram_addr which is used to look up MB base address in 660). Table indexer 665 generates a table index or group index from input run, level pair 610, which is added to offset address 662 and output by adder 670 as three field table address 672. For example, table indexer 665 may include shift/indexing logic or table index logic to generate an index or offset of an address within the group of symbols or run, level pairs of the table corresponding to the address asserted at address 636, that stores the appropriate binary code, length code, flip code combination for input run, level pair 610. Adder 670 may correspond to block 550 of FIG. 5.

Three field table address 672 is then used to look up a binary code, length code, and flip code from three field table 680 where table 680 may be a table as described herein for table 372. For example, three field table address 672 may be the address in memory of three field table 680 at which the appropriate binary code, length code, flip code combination is to be retrieved or read corresponding to input run, level pair 610. Three field table 680 may correspond to block 450 of table 4 and/or block 555 of table 5. Output 682 is the binary code, length code, and flip code retrieved or read from three field table 680. For instance, output 682 may be sent to a retrieval unit which will read or obtain the appropriate binary code, length code, flip code combination for input run, level pair 610. It is contemplated that output 682 and output 656 may correspond to or continue to block 460 of FIG. 4.

It is considered that the couplings, connections, lines, or data paths connecting devices, apparatus, systems, modules or components herein (e.g., such as those shown and described with respect to FIGS. 1, 2, and 6) may be sufficient electronic interfaces or couplings, such as various types of digital or analog electronic data paths, including a data bus, a link, a wire, a line, a printed circuit board trace, a wireless communication system, etc.

In addition, according to embodiments, the output from Run-Level Encode stage such as block 420, may be arranged as shown in Table 3 where field0=run, field1=level and field3=table_select, such as in Input 610.

TABLE 3

| 16 Bit Input Form | | | | | | | | | | | | | | | |
|---|---|---|---|---|---|---|---|---|---|---|---|---|---|---|---|
| 15 | 14 | 13 | 12 | 11 | 10 | 9 | 8 | 7 | 6 | 5 | 4 | 3 | 2 | 1 | 0 |
| field3 | field2 | | | | field1 | | | | | | field0 | | | | |

Thus, table partitioning may be done by programming registers as shown in Table 4, where each MB (Memory Block), such as in configuration register 622, has a 31 bit programmable register (MBx_reg) which is divided into following fields:

TABLE 4

| MB Programmable Register Format | | | | | | | | | | | | | | | |
|---|---|---|---|---|---|---|---|---|---|---|---|---|---|---|---|
| 31 | 30 | 29 | 28 | 27 | 26 | 25 | 24 | 23 | 22 | 21 | 20 | 19 | 18 | 17 | 16 |
| | MBxF3 | | MBxHF2 | | | MBxLF2 | | | | MBxHF1 | | | | MBxLF1 | |
| 15 | 14 | 13 | 12 | 11 | 10 | 9 | 8 | 7 | 6 | 5 | 4 | 3 | 2 | 1 | 0 |
| | MBxLF1 | | | | MBxHF0 | | | | | | MBxLF0 | | | | |

The 'x' may stand for the MB number (e.g., MB0, MB1, etc), 'L' may stand for Low and 'H' may stand for High. In short, 'MxLF0' may mean Lower bound field0 for MBx. Each MB has a comparator, such as compared on 624, to compare the incoming data with user programmed configuration register and if the conditions match, generates a RAM select signal and a constant 4 bit address such as address 636, corresponding to that particular MB. If no match is found, the codes may not be present in the code_tables and hence encoding may be performed using escape codes. Escape code enabling may be implemented using simple OR gate, such as OR 652, whose inputs are ram_select signal from all the MBs, such as address 636; and the output is sent out via the escape_code signal, such as escape coding 656. In general, Table 4 and/or corresponding structures of FIG. 6, or software having the functionality thereof, may implement the following equation:

$MB - x\_sel = (in\_field0 >= MBxLF0$ AND $in\_field0 <= MBxHF0)$

AND $(in\_field1 >= MBxLF1$ AND $in\_field1 <= MBxHF1)$

AND $(in\_field2 >= MBxLF2$ AND $in\_field2 <= MBxHF2)$

AND $(in\_field3 == MBxF3)$.

For example, a user can program the MB shift registers in accordance with the following equations to derive the shift amount within a table or group of symbols, such as is described herein with respect to table indexer 665, adder 670, and Tables 3–7:

TABLE 5

MB Shift Register Format

| 10 | 9 | 8 | 7 | 6 | 5 | 4 | 3 | 2 | 1 | 0 |
|---|---|---|---|---|---|---|---|---|---|---|
| MBxF3_SHIFT | | | MBxF2_SHIFT | | | | MBxF1_SHIFT | | | |

It is contemplated that a user may program the MB base address table (e.g., register 620) may be with 16 bit values, and the MB_addr generated by the comparator above (e.g., address 636) may be used to index the base address at MB_base_addr_table (e.g., at table 660). The data read out from this table may be added, such as at adder 670, to the input to generate code_table_addr, such as input 610. This summed address, such as address 672, may be used to index the code_table, such as table 680. The code_table outputs may be in the form of three fields: binary code, length and flip bit as shown in Table 5, such as output 682. They may be sent to the bit packing block, such as block 480, where they are properly packed and send out via an output register.

TABLE 6

Code Table Entry Format

| 12 | 11 | 10 | 9 | 8 | 7 | 6 | 5 | 4 | 3 | 2 | 1 | 0 |
|---|---|---|---|---|---|---|---|---|---|---|---|---|
| Flip | Length | | | | | Code | | | | | | |

It is contemplated that embodiments, such as those described above for FIGS. 3–6 and Tables 2–6, may be implemented as electronic or computer hardware, software, and thus may be described by pseudo code for a hardware implementation. For example, Table 7, below, is a pseudo code example for comparing input run, level pairs 610; looking up a base or offset address in offset table 660; calculating three field table address 672 at adder 670; looking up output 682 at three field table 680; and bit packing output 682; such those described above for FIGS. 3–6 and Tables 2–6.

TABLE 7

Hardware Pseudo Code Example

```
//pseudo code for hardware implementation
//Comparator logic
//Memory Block 0 selection
if(MB0LF0<=in_field0<=MB0HF0) AND
(MB0LF1<=in_field1<=MB0HF1) AND (MB0LF2<=in_field2<=MB0HF2)
AND (in_field3 == MB0F3) {
ram_addr <= "0000";
ram_sel <= "1";
}
//Memory Block 1 selection
elsif(MB1LF0<=in_field0<=MB1HF0) AND
(MB1LF1<=in_field1<=MB1HF1) AND (MB1LF2<=in_field2<=MB1HF2)
AND (in_field3 == MB1F3) {
ram_addr <= "0001";
ram_sel <= "1";
}
. . . .
//Memory Block 15 selection
elsif(MB15LF0<=in_field0<=MB15HF0) AND
(MB15LF1<=in_field1<=MB15HF1) AND
(MB15LF2<=in_field2<=MB15HF2) AND (in_field3 == MB15F3) {
ram_addr <= "1111";
ram_sel <= "1";
}
else {
escape_coding <= "1";
}
// Calculate table index address. Here x = ram_addr
tmp1 <= (in_field3 << MBxF3_SHIFT) OR (in_field2 - MBxLF2)
tmp2 <= (tmp1 << MBxF2_SHIFT) OR (in_field1 - MBxLF1)
table_index <= (tmp2 << MBxF1_SHIFT) OR (in_field0 - MBxLF0)
// Now lookup MB base table ram to find out the appropriate user
provided base address
if(ram_sel) {
//Lookup MB_base_table indexed by addr=ram_addr
MB_base_addr <= MB_base_table[ram_addr]
}
// calculate the address for code lookup
```

TABLE 7-continued

Hardware Pseudo Code Example

```
code_table_addr <= table_index + MB_base_addr
// using this address, find out the code from code_table
(flip, length, code) <= code_table[code_table_addr]
// Now bitpack the code
code_tmp1 <= code;
//add prefix zeros using length field
code_tmp2 <= prefix_zeros(length - code_tmp1'length) + code_tmp1;
//flip the code, if flip is set
if(flip==1) code_out <= not(code_tmp2);
else code_out <= code_tmp2;
```

According to embodiments, for VLC MPEG2 coding of an input, there may be 172 entries in the code_table ram, 7 Memory Blocks (MBs), 7 entries in MB_base_address_table and 3 fields (field0, field1 and field3), such as described for Tables 3–7. For VLC coding of an MPEG4 input, there may be 230 entries in code_table ram (e.g., such as 230 entries on table 680 or 372), 14 MBs, 14 entries in MB_base_address_table and 3 fields, such as described for Tables 3–7. Thus, it is considered that electronic hardware may implement 256 entries for code_table ram (e.g., such as 256 entries on table 680 or 372), 16 MBs, 16 entries in MB_base_address and 4 fields, as described above and may provide programmable or selectable entries and fields to cover or provide for VLC coding of MPEG2 and MPEG4 formatted input data. Moreover, it is contemplated that embodiments may include complete user programmability control and support for future video standards.

Finally, the following is an example of a process for variable length coding of a video or image input data stream having bytes 0, 0, 0, 0, 0, 0, 0, 0, 2, 0 . . . . This input data stream may be produced by a process, such as identified with respect to block 410 corresponding to FIG. 4. Next, the bytes of input stream may be converted to run, level pair (run=8, level=2) (e.g., such as a run, level pair as shown and described above for Table 3) such as described with respect to block 420, and/or input run, level pair 610. This run, level pair of (8,2) falls as second entry in MB1 of FIG. 3. Consider that field0 is programmed as 'run' while field1 is programmed as 'level', such as of Table 3. Further, the MB1_reg, such as configuration register 632, is programmed such that MB1LF0=7, MB1HF0=16, MB1LF1=2 and MB1HF1=2. The MB1F1_SHIFT register would be programmed as $\log_2(16-7)=4$. The address corresponding to the first entry of MB1 in FIG. 3 (run=7, level=2) would be 0 . . . 000010000111=0x87. Assume that all the elements (e.g., such as run, level pair and three field, binary, length and flip codes) corresponding to the value identified by register 632 are stored in memory block (MB1) of code_table memory (e.g., such as table 680) and, thus start at location 0x100 (e.g., such as at a location identified by an offset or base address value stored in table 660). Hence, the offset or base address entry corresponding to MB1 in MB_base_addr_table (e.g., such as table 660) may be programmed with a value=0x0100.

Consider that 0x0088 corresponding to run=8, level=2 (e.g., such as Input run, level pair 610) is to be coded and thus, is the input to a number of range detectors having similar configuration registers to register 632 programmed to detect different ranges corresponding to different groups of elements in memory and address offsets and having computer bytes for each MB. All the comparator units try to compare this input to data stored in the configuration registers, but only MB1 comparator, such as comparator 634, gets a hit, such as described at block 535, because 7<=run<=16 AND 2<=level<=2. Hence comparator for MB1, such as comparator 634, generates the ram_select signal and also a constant 4 bit address (0b0001), such as address 636, and such as described at blocks 440 and 540. The MB_base_addr_table, such as table 660, is read at address (0b0001) and the corresponding value (0x0100), such as offset address 662 is retrieved or read out. Next the table index is calculated such that table_index=((2-2)<<4) OR (8-7)=1.

This value is added, such as at adder 670, with MB_base_addr, to generate the code_table address=0x1+ 0x100=0x101, such as described at block 550. This address is used to index the code_table, such as table 370, table 680, and/or described at block 555, and the corresponding entry is read out which is the code word corresponding to run=8, level=2, such as described at block 450. For instance, value read out may be 0xC11, such as at output 682. This value may then be decoded as binary code=0x11, length code=0xC, and flip code=0. This information may be sent to the bitpacking logic, such as described at block 480, which could pack this code as VLC "000000010001", such as described at block 470.

In the foregoing specification, specific embodiments are described. However, various modifications and changes may be made thereto without departing from the broader spirit and scope of embodiments as set forth in the claims. The specification and drawings are, accordingly, to be regarded in an illustrative rather than a restrictive sense.

What is claimed is:

1. An apparatus comprising:
    a memory including:
        a plurality of combinations, each combination having of a binary code, a length code, and a inversion bit; and
        a plurality of data symbols, wherein each of the combinations is associated with one of the data symbols;
        wherein the binary code identifies a first portion of a variable length code conversion for the associated, data symbol;
        the length code indicates one of a number of asserted bits and a number of unasserted bits in a different second portion of the variable length code conversion;
        and the inversion bit indicates whether the first and second portions are the inverse of the variable length code conversion.

2. The apparatus of claim 1, wherein the binary code, length code, and inversion bit together contain a number of bits of data that is less than a number of bits of data for a Huffman code of the associated, data symbol.

3. The apparatus of claim 1, wherein the variable length code conversion is a Huffman code and the memory is part of a programmable multi-instruction multiple data stream digital image processing device.

4. The apparatus of claim 1, wherein the plurality of combinations and the plurality of data symbols are part of one of a data structure, a data converter, a lookup table, and an encoder coupled to a hardware accelerator of a signal processor.

5. The apparatus of claim 1, wherein the data symbols include a plurality of selected groups of data symbols, each selected group having a first data symbol at a memory address offset.

6. The apparatus of claim 5, wherein the plurality of selected groups of data symbols include data symbols repeated in a plurality of data symbol to variable length code conversion tables.

7. The apparatus of claim 5, further comprising an adder to add the memory address offset to a group index for the first data symbol to calculate a memory address from which to retrieve a combination from the memory.

8. The apparatus of claim 5, the data symbol includes a run byte and a level byte, wherein the run byte indicates a number of unasserted bytes before an asserted byte of a digital data stream of image data and the level byte indicates the value of the asserted byte of the digital data stream of image data.

9. The apparatus of claim 8, further comprising:
at least one range detector to determine a value of the run byte and a value of the level byte;
an offset table to convert the value of the run byte and the value of the level byte to a memory address offset; and
a retrieval unit to retrieve a combination from an address in the memory equal to the memory address offset for the data symbol added to the value of the run byte and the value of the level byte.

10. The apparatus of claim 1, further comprising:
a plurality of processing elements having an addressing space;
a plurality of registers to transfer data between the plurality of processing elements, wherein each of the registers is shared by and mapped to the addressing space of each processing element of the plurality of processing elements;
wherein the memory is a local memory of a first of the processing elements configured as a memory command handler (MCH) to read and write data between the plurality of communication registers and the local memory, and a second different of the processing elements is configured as a hardware accelerator to lookup variable length code conversions from a table stored in the local memory via the MCH.

11. The apparatus of claim 1, wherein the binary code excludes leading 0's and includes a first selected number of bits, the length code includes a second selected number of bits that is less than the first selected number of bits, and the inversion bit includes a third selected number of bits that is less than the second selected number of bits.

12. A method comprising:
converting a plurality of symbols to a plurality of combinations of a first code, a second code, and a third code; wherein each of the plurality of combinations is associated with one of the symbols and a variable length code for the one symbol, and wherein the second code is a length code identifying a number of unasserted bits to be appended with the first code to form a variable length code conversion for the associated symbol and wherein the third code indicates whether the unasserted bits and the first code are the inverse of the variable length code conversion.

13. The method of claim 12, wherein the first code is a binary code having an asserted most significant bit (MSB) and representing a first portion of a variable length code conversion for the associated symbol, the second code is a length code identifying a number of leading zeros to represent the second portion of the variable length code conversion for the symbol, and the third code is a flip code indicating whether the variable length code conversion for the symbol is the inverse of the first and second portions.

14. The method of claim 12, wherein converting includes:
identifying a memory address offset for a symbol, wherein the memory address offset is a first memory address of a selected group of the symbols stored in a memory; and
retrieving a combination associated with the symbol from an address of the memory equal to the memory address offset added to a group index for the symbol.

15. The method of claim 12, further comprising:
creating an associated variable length code for the one symbol from the associated combination;
appending the associated variable length code to a stream including a plurality of other variable length codes.

16. The method of claim 15, wherein creating includes:
appending a number of unasserted bits to the first code to produce a lengthened code having a number of bits indicated by the second code; and
if the third code is asserted, inverting the lengthened code.

17. The method of claim 16, further comprising deriving the plurality of symbols from a data stream having 0's and other entities, wherein deriving includes:
determining a run portion of the symbol as a number of unasserted bits before an asserted bit; and
determining a level portion of the symbol as a value of an entity of bits including the asserted bit.

18. The method of claim 17, wherein deriving, converting, and creating comprise compressing a digital data input into a Moving Picture Experts Group (MPEG) format.

19. A system comprising:
a memory;
a data structure stored in the memory including:
a plurality of unique combinations, each combination having a binary code, a length code, and a flip code;
a plurality of unique run, level pairs, wherein each of the run, level pairs corresponds to one of the combinations;
a video signal processor coupled to the memory to produce a variable length code conversion for the run, level pairs that is equal to a number of unasserted bits to have a length of bits identified by the length code, appended to one of: (1) the binary code, and (2) the inverse of the binary code if the flip code is asserted.

20. The system of claim 19, further comprising:
a plurality of image signal processors (ISPs), each of the ISPs coupled to at least two other of the ISPs, each of the ISPs including a plurality of communication registers and a plurality of processing elements;
a main memory coupled to at least one of the plurality of ISPs;
wherein each of the plurality of communication registers is mapped directly to an address space of each processing element of the plurality; a first of the plurality of processing element is the video signal processor, and a memory local to a second different of the plurality of processing elements is the data structure stored in a memory.

21. The system of claim 19, wherein the plurality of unique run, level pairs include a plurality of selected groups of run, level pairs, each selected group of run, level pairs including one of:
   (a) redundant run, level pairs defined by repeats of the run, level pairs in a plurality of tables for converting run, level pairs to variable length codes;
   (b) run, level pairs having a constant run value of the run, level pair; and
   (c) run, level pairs having a constant level value of the run, level pair.

22. The system of claim 21, further comprising a plurality of memory address offsets in the memory, wherein each of the selected groups start at a memory address offset.

23. The system of claim 19, wherein the binary code includes 6 bits, the length code includes 5 bits, the flip code includes one bit, and the variable length code includes up to 16 bits.

24. The system of claim 19, wherein the run, level pairs and the variable length code correspond to a Moving Picture Experts Group (MPEG) encoding of one of an image and a video digital data stream.

25. A machine-accessible medium containing instructions that, when executed cause a machine to:
   a) convert a run, level pair to a combination of an asserted code, a length identifier, and a flip identifier; and
   b) create a unique variable length code for the run, level pair from the combination,
   wherein the length identifier identifies a number of unasserted bits to be appended with the asserted code to form the unique variable length code.

26. The machine-accessible medium of claim 25, further comprising instructions that, when executed cause a machine to:
   derive a plurality of unique run, level pairs from a digital data stream of an image;
   convert the plurality of run, level pairs to a plurality of unique combinations of an asserted code, a length identifier, and a flip identifier; and
   create a plurality of unique variable length code for the plurality of run, level pairs from the plurality of combinations.

27. The machine-accessible medium of claim 25, wherein the asserted code includes asserted bits that correspond to a first set of bits or an inverse of the first set of bits of a variable length code conversion of the associated run, level pair, the length identifier identifies a number unasserted bits that correspond to a second set of bits or an inverse of the second set of bits of a variable length code conversion of the associated run, level pair, and the flip identifier identifies whether variable length code conversion of the associated run, level pair is the first and second set of bits or the inverse of the first and second set of bits.

28. The machine-accessible medium of claim 25, further comprising instructions that, when executed cause a machine to:
   append a number unasserted bits to the asserted code to create a lengthened code including the asserted code and the number of unasserted bits, and having a number of bits identified by the length identifier; and
   if the flip identifier is asserted, invert the lengthened code bits from asserted to unasserted or from unasserted to asserted.

* * * * *

UNITED STATES PATENT AND TRADEMARK OFFICE
CERTIFICATE OF CORRECTION

PATENT NO. : 7,113,115 B2 Page 1 of 1
APPLICATION NO. : 10/882460
DATED : September 26, 2006
INVENTOR(S) : Partiwala et al.

It is certified that error appears in the above-identified patent and that said Letters Patent is hereby corrected as shown below:

Column 4, at line 36, delete the second occurrence of "a".
Column 16, at line 55, delete ",".

Signed and Sealed this

Fourth Day of December, 2007

JON W. DUDAS
*Director of the United States Patent and Trademark Office*